United States Patent [19]

Krook

[11] Patent Number: 5,454,006
[45] Date of Patent: Sep. 26, 1995

[54] METHOD AND APPARATUS FOR BANDWIDTH LIMITED BINARY SIGNALS

[75] Inventor: Göran Krook, Täby, Sweden

[73] Assignee: Unitex AB, Sollentuna, Sweden

[21] Appl. No.: 969,234

[22] PCT Filed: Jul. 18, 1991

[86] PCT No.: PCT/SE91/00501

§ 371 Date: Jan. 13, 1993

§ 102(e) Date: Jan. 13, 1993

[87] PCT Pub. No.: WO92/01081

PCT Pub. Date: Feb. 6, 1992

[30] Foreign Application Priority Data

Jul. 18, 1990 [SE] Sweden .................. 9002460

[51] Int. Cl.$^6$ .................................. H04L 27/00
[52] U.S. Cl. .................. 375/259; 375/240; 375/292; 341/54; 341/58; 341/177
[58] Field of Search ............... 375/25, 37, 94, 375/122, 19; 341/52, 54, 58, 70, 71, 74, 63, 111, 173, 177, 56

[56] References Cited

U.S. PATENT DOCUMENTS

| | | | |
|---|---|---|---|
| 4,101,934 | 7/1978 | Fukuoka | 375/25 |
| 4,153,814 | 5/1979 | Burgert | 375/25 |
| 4,369,472 | 1/1983 | Tanaka et al. | 375/37 |
| 4,626,826 | 12/1986 | Fukuda et al. | 375/19 |
| 4,747,113 | 5/1988 | Viallevicille | 375/25 |

*Primary Examiner*—Stephen Chin
*Assistant Examiner*—Don Vo
*Attorney, Agent, or Firm*—Sprung Horn Kramer & Woods

[57] ABSTRACT

In a method for limiting the bandwidth of a selected binary signal (B), there is produced a modulated digital signal (D) which presents a continuous series of changes in signal level. The two occurrent logic states (1,0) are each represented by a respective symmetrical pulse train, wherein the frequencies f1, f2 of the pulse trains are mutually different. The higher frequency f2 is equal to the number of bits transmitted each second divided by two herz. The transition between the two pulse trains is arranged so that the integral of the resultant signal will be zero within the duration of three of four data bits. In a preferred embodiment of a coder and decoder each include a code word counter which, together with a combinatory logic circuit (code word table) activates or is activated by a shift register for transmitting or receiving respectively the modulated digital signal.

10 Claims, 2 Drawing Sheets

Fig. 1

```
     |TB|
      1    — B
     |.1.| — C
      ___
   __|   |__ — D
   0    0    — RDS
```

Fig. 2a

```
      0    1   — B
     |.2.|.0.| — C
         ___
   _____|   |__ — D
   0   -1   0   — RDS
```

Fig. 2b

```
      0    0    1   — B
     |.0.|.7.|.0.| — C
         _____
   _____|       |__ — D
   0   -1   -1   0   — RDS
```

Fig. 2c

```
      0    0    0    1   — B
     |.2.|.2.|.2.|.0.| — C
       _   _   _
   ___| |_| |_| |__ — D
   0  -1  0  -1   0  — RDS
```

Fig. 2d

```
      0    0    0    1   — B
     |.0.|.2.|.0.|.0.| — C
         _____
   _____|           |__ — D
   0   -1  -2  -1   0  — RDS
```

Fig. 3

```
               |TB|
      0    0    0    0   — B
     |.0.|.7.|.2.| — C
         _____
   _____|     |__ — D
   0   -1   -1   0   — RDS
```

METHOD AND APPARATUS FOR BANDWIDTH LIMITED BINARY SIGNALS

TECHNICAL FIELD

The present invention relates to a method of limiting the bandwidth of a selected binary signal, by generating a digital signal which exhibits a continuous series of changes in signal level. The two logic states are each represented by a respective pulse train, which have the respective frequencies f1 and f2.

BACKGROUND ART

Several different digital signal transmission methods are described in the literature. For example, various textbooks describe methods which are generally known under the designations NRZ-coding, Bifas-coding and DM-coding. See, for instance, the product catalogue "Z16C30 CMOS USC Universal Serial Controller", May 1989, ZILOG Inc., Campbell, Calif. 95008-6609, U.S.A., page 8.

The most simplest and the most common coding method is the NRZ method (Non Return to Zero), which implies that a logic one is represented by a high signal and a logic zero is represented by a low signal (or vice versa). NRZ-signalling requires a transmission channel that has a bandwidth of from 0 to 1/TB Hz, where TB is the duration of a data bit in seconds. The NRZ-code has a large direct voltage (DC) component, which renders it unsuitable when the lower band limit differs from 0. Neither does NRZ coding ensure that a minimum time lapse between two mutually sequential changes in signal level will always be present in any given binary data signal, which means that a clock signal representing the position of each data signal bit, cannot be obtained from the data signal, but must be transmitted on a separate channel.

Another method is the Bi-phase code method. In the Bi-phase code, at least one and at most two changes in signal level always occur with each bit interval. Although this enables the clock signal to be obtained from the coded signal, the bandwidth of the transmission channel is increased to 0–2/TB. The most serious drawback with the Bi-phase codes is that the upper band limit is twice the upper band limit with NRZ signalling.

The Manchester code is a variant of Bi-phase modulation, also known as Biphase-level, where a logic one is coded as ½TB high signal level followed by ½TB low signal level and a logic zero is coded as ½TB low signal level followed by ½TB high signal level. The Manchester code is therefore dependent on polarity.

The DM-code (Delay Modulation) or the Miller code is another method which, similar to the Bi-phase code, enables the clock signal to be regenerated from the modulated data signal, but lacks the drawback of the Bi-phase code with respect to the high upper band limit. The DM-code modulated data signal, however, is completely void of direct voltage components. In DM, a logic one is coded as a change in signal level in the middle of the bit interval and a logic zero is coded as a change in signal level at the end of the bit interval, only if it is followed by a further zero.

Both the Manchester codes and the DM codes also have the drawback that in the case of an infinite stream of ones or zeroes, the modulated data signal is identical to the phase shift of solely ½ data bit. This results in a synchronization problem, since it is necessary for the receiver (the decoder) to be aware of the phase position in order to be able to decode the modulated signal correctly.

SUMMARY OF THE INVENTION

The object of the present invention is to provide a method which will avoid the drawbacks associated with the known methods and to modulate a digital signal so that the resultant signal will be more suited for transmission over bandwidth limited media, for example a cable.

This is achieved in accordance with the invention in that the frequencies f1, f2 of the pulse train of the modulated digital signal are mutually different, and in that the higher frequency, f2, is equal to the number of data bits per second divided by two (½TB). The transition between the two pulse positions is arranged so that the integral or Run Length Digital Sum (RDS) of the resultant signal will be equal to zero within the duration of four transmitted data bits (4TB).

The modulated signal is coded differentially, so that it is the transitions or junctions from one signal level to the other that are information carrying (and not the actual levels themselves). This implies a polarity dependency.

In a particularly preferred embodiment of the inventive method, in which the selected binary input signal is an NRZ-signal, the following coding table is used for translating the selected NRZ-signal:

Coding Table

| Input Signal (NRZ) | Code Word Counter | Code Word 3-base | Code Word Binary |
|---|---|---|---|
| I    1    | 0 | 1 | 10 |
| II   01   | 1 | 20 | 0100 |
| III  001  | 2 | 010 | 001000 |
| IV   0001 | 3 | 0200 | 00010000 |
| V    000* | (3+1) | 012 | 001001 |

+ = one or more zeroes: The first 3 zeroes are coded in accordance with the code word, whereafter there remains at least one further zero.

The code word is twice the length of the coded binary bit pattern, such that 2 bits for each NRZ-bit are used for modulating the recording medium. The code word modulates the recording means so that a logic one (1) will result in a change in signal level after the bit interval, and so that a logic zero (0) will result in no change in signal level.

The code word can also be expressed as a trinary value (with the base 3). When the code word is expressed with the base 3, corresponding reasoning is then: The code word modulates the recording means such that a one (1) results in a change in signal level in the middle of the bit interval, a two (2) will result in a change in signal level after the bit interval, and a zero (0) will result in no change in signal level. This is a definition of the code word. It can also be said that a one (1) results in a change in signal level at the BEGINNING of the bit interval and a two (2) in the MIDDLE of the bit interval. This is similar to the place change of the numerals 1 and 0 of the NRZ-data.

It will be seen from the coding table that the modulated signal contains signal transitions or junctions with time intervals in steps of TB/2, although never less than 1TB and never more than 4TB.

The code word is transmitted differentially, such that the NRZ-signal in the second row of the code table (01) is modulated to 0011 when the preceding bit is 0, or to 1100 when the preceding bit is 1.

Synchronization is achieved because, in the resultant bit stream, which is composed of the code words, the sequence 10101 (binary) is unique for three consecutive ones (111) in the original NRZ-signal. This fact is utilized by the receiver (the decoder) for determining the phase position of the incoming bit stream.

DESCRIPTION OF PREFERRED EMBODIMENTS

Figure 4:
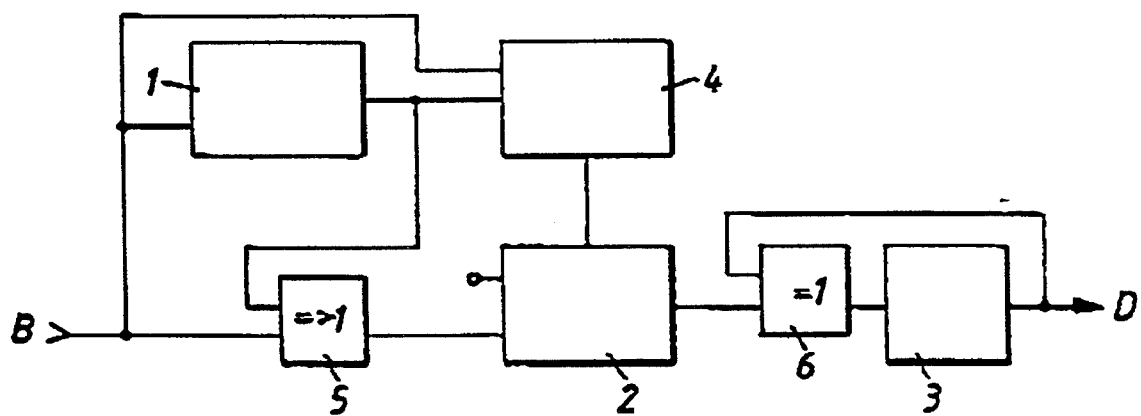
Figure 5:
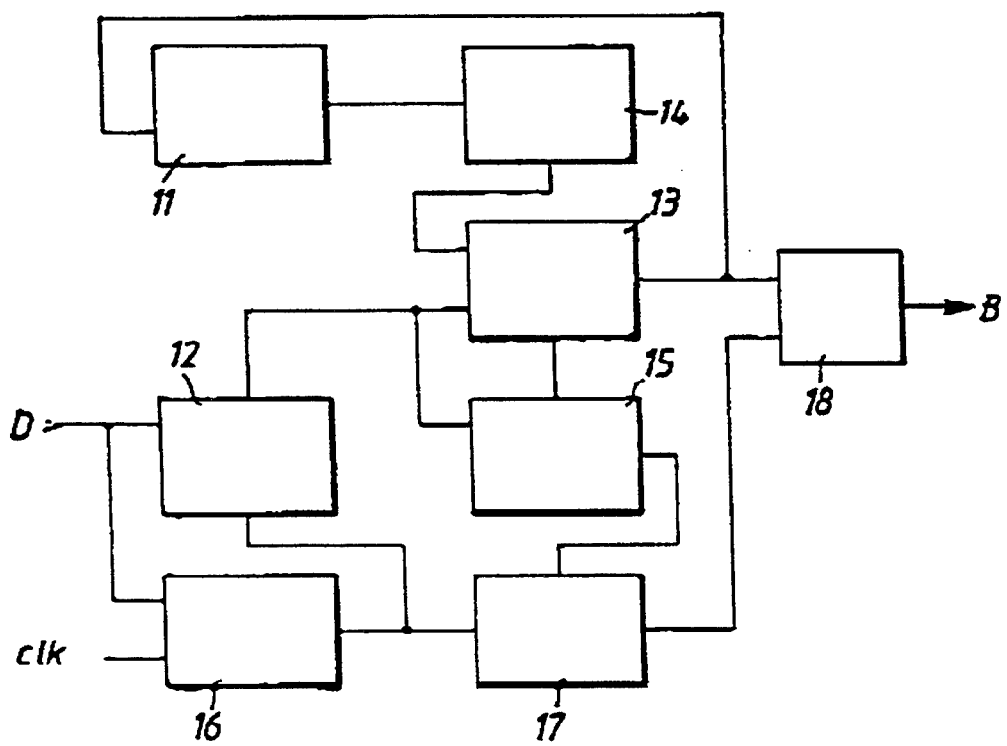

The method according to the present invention will now be described in more detail with reference to the accompanying drawings, in which FIGS. 1, 2a, 2b, 2c, 2d and 3 illustrate the modulation of signal level at different conceivable sequences of logic ones and zeroes in the digital input signal;

FIG. 4 illustrates an exemplifying coder arrangement by means of which the coding method can be carried out and which lies within the scope of the invention; and FIG. 5 illustrates an exemplifying decoder arrangement by means of which the decoding method can be carried out and which lies within the scope of the invention.

The binary input signal B is illustrated in the Figures by different sequences of logic ones, 1, and zeroes, 0, that can occur. The code word sequence C (expressed with the base 3) is given during each such binary signal, this sequence being used in the inventive method. Shown beneath these sequencies is the resultant digital signal D, which in the illustrated and described preferred embodiment of the invention has been modulated in accordance with the inventive method in a manner such that the highest and the lowest frequency will be 2/TB and 1/STB respectively. The reference sign and magnitude TB signifies respectively a bit interval and the duration in seconds respectively of a data bit. Shown on the bottom line in each of FIGS. 1–3 are the values of the integral RDS (Run Length Digital Sum), which according to the method shall be equal to zero within a period of 4TB.

FIG. 1 shows a selected binary signal B which contains a sequence of logic ones, 1, i.e. each bit interval TB consists of a logic one. According to the invention, such a sequence of logic ones is modulated with code word C, which in FIG. 1, and also in the Figures following FIG. 1, is expressed as a trinary, and results in the digital signal D. Thus, a logic one is coded as a change in the middle of each bit interval TB when this logic one is preceded by another logic one. This is presented as case I in the Coding Table presented above.

FIG. 2a illustrates case II according to the Coding Table, in which a zero is followed by a one. Thus, the digital signal D is modulated by a change in signal level after the bit interval TB in which the logic zero occurs. If the selected binary signal B contains a sequence of two logic zeroes followed by a logic one, as illustrated in FIG. 2b and presented as case III in the Coding Table, the digital signal D is modulated by a change in signal level in the middle of the bit interval TB that includes the second logic zero.

FIG. 2c illustrates a conceivable coding possibility when the selected binary signal B includes a sequence of three logic zeroes which are followed by a logic one. In this case, the coding is obtained by modulating the digital signal D such as to present a change of its signal level after each bit interval TB that includes a logic zero. However, it has been found more advantageous to modulate the digital signal D such as to present a change in signal level after the second bit interval TB that includes a zero, as will be seen from FIG. 2d and illustrated with case IV in the Coding Table presented above.

In those instances when the selected binary signal B includes a sequence of more than three zeroes prior to a subsequent one, case V in the Coding Table presented above, the digital signal D is modulated in accordance with the present invention such as to present a change in its signal level at both the middle of the second bit interval TB and at the end of the third bit interval TB. This is shown in FIG. 3.

In order to illustrate how the inventive method can be realized, a coding arrangement and a decoding arrangement will now be described with reference to FIGS. 4 and 5. It will be understood, however, that these two arrangements are merely given by way of example only and that the method can be practiced equally as well with other arrangements or with a modified arrangement.

CODER

A coding arrangement by means of which the inventive method can be carried out includes a code word counter 1, a shift register 2, a feedback-connected flip-flop 3 and a combinatory logic 4 which forms a code word table. The code word counter 1 is constructed to count-up one step for each pulse and if the counter counts-up from 3, it will become 1. It can only be zero when set to zero. (Zero setting 0-1-2-3-1-2-3-1-2-3-1). Incoming bit streams are detected at a rate of 1/TB. The shift register 2 and the feedback-connected flip-flop 3 are clock controlled at 2/TB. The code word counter 1 is clock controlled at a rate of 1/TB.

At the beginning of a coding process, the shift register 2 is set to 10101010, which is the state to which it would be set after four NRZ-ones (1111), in order to enable the receiver (the decoder in FIG. 5) to be able to find the correct phase position in the modulated signal D. When an incoming data bit is a logic one (1), the code word is read in that row to which the code word counter 1 points and this code word is inserted in the shift register 2, whereafter the code word counter 1 is set to zero. When the incoming data bit is zero (0) and the code word counter 1 is numeral 3, the code word is read in line 3+ and this code word is introduced into the shift register 2 with a displacement or shift of two steps. When the incoming data word is zero (0), the code word counter 1 counts-up one step. Only the logic ones of the code word C (FIGS. 1–3) need be written into the shift register 2, since a logic zero is clocked into the least significant bit in each clock cycle.

The feedback-connected flip-flop 3 is advantageously coupled back via an XOR-gate 6.

DECODER

An arrangement for regenerating a selected binary signal B from a modulated signal D includes a code word counter 11, a shift register 12, two flip-flops 17, 18, a phase-locked loop (DPLL) 16 and combinatory logic which forms code word table 14, a comparator 13 and a synchronizing detector 15. The construction of the code word counter 11 coincides with the construction of the code word counter 1 in the coder arrangement. One of the aforesaid flip-flops is a RXC flip-flop 17 which, in response to a signal from the synchronizing detector 15, is intended to activate an output flip-flop 18 from which the regenerated selected binary signal B can be obtained. The shift register 12 and the RXC flip-flop 17 are clock controlled at a rate of 2/TB. The code word counter 11 and the output flip-flop 18 are clock controlled at a rate of 1/TB.

The incoming signal D, which consists of a signal modulated in accordance with the method (ADPC High Density Pulse Code) is delivered to the digital phase-locked loop (DPPL) 16 which is operated at a frequency which is several times higher than the frequency of the incoming signal D (e.g. 16/TB). When the signal is detected, there is produced on the output of the DPLL-loop 16 a clock signal (2/TB) which is in phase with the incoming signal D. The clock signal 2/TB is used to clock the coded signal D into the shift register 12. When the last five bits in the shift register 12 are 10101, the flip-flop of the synchronizing detector 15 flips, wherein the RXC flip-flop 17 is activated and produces a clock signal having the frequency 1/TB, which is in phase with the regenerated binary signal B. The code word indicated by the code word counter 11 is compared with the content of the shift register 12 in each RXC cycle. If the code word coincides with the content of the shift register, a logic one (1) is clocked into the output flip-flop 18 and the code word counter 11 is set to zero. If there is no such coincidence, a logic zero (0) is clocked into the output flip-flop 18 and the setting of the shift register 12 is controlled so as to coincide with the beginning of a longer code word or, when the code word counter 11 is 3, so that the shift register 12 contains the code word in the line (3+) according to the above described Coding Table. If an error is detected, the synchronizing flip-flop 15 is reset and the decoder again searches for the synchronizing pattern.

The described exemplifying coder/decoder embodiment is only suited for an NRZ-code which, in turn, is coded according to some supervisory protocol, for example with start and stop bits which are able to distinguish the original signal from the decoded signal when the decoded signal is introduced by a number of logic ones (those that were used for synchronization) and is terminated with logic zeroes. The terminating zeroes can be avoided by delaying the NRZ-signal through a plurality of series-connected flip-flops (not shown).

The method can be extended with special code words which can be used for more advanced synchronization and control of a communication channel.

A full implementation for transferring blocks of binary data of selected content and length in the form of a data package can be constructed in accordance with the following, in which the code words are expressed in base 3:

|  | ... 11111111 | preamble |
|---|---|---|
|  | 22020111 | beginning of frame type 1 |
| or | 22010201 | beginning of frame type 2 |
| or | 22010120 | beginning of frame type 3 |
| or | 22010010 | beginning of frame type 4 |
|  | xxxxxxxx | 0–∞ number of data bits |
|  | 22010202 | end of frame mark |
|  | 02020020 ... | postamble |

Thus, a selected binary signal B can be transmitted with pronounced bandwith limitation with the aid of the inventive method. The thus modulated digital signal D is truly binary, having solely two levels. When practicing the present invention, there is obtained a bit-coded signal of high information density, high power spectrum and narrow bandwidth, which we have accordingly designated HDPC, High Density Pulse Code. The bit-code modulated signal contains no direct voltage component and is, in itself, clock controlled. In the case of data communication, there is obtained with this bit-code modulated signal automatic (re-) synchronization and phase error detection. The inventive method is well-suited for use within both data communcation and for storing digital information. In the case of data communication, the method can be used with both point-to-point and with bus (multidrop) connections and data can be transmitted continuously or in block form (data package).

It will be understood that the illustrated circuit construction described with reference to FIGS. 4 and 5 merely represents an example of how the inventive method can be realized. Each of the aforediscussed coding and decoding functions can be integrated in a single logic circuit. It will also be obvious to one of normal skill in this art that the method can be applied with other techniques which include sequential logic, with or without the aid of a read memory for translating bit patterns, or as a state machine.

I claim:

1. A method of producing a coded digital signal which represents a selected binary signal having two logic states, whereby the coded digital signal exhibits a continuous series of signal level changes and the two logic states of the selected binary signal are each represented by a respective symmetric pulse train having frequencies f1 and f2, thereby limiting the bandwidth of the selected binary signal, the method comprising the steps of:

selecting a binary signal to be coded for transmission, the binary signal having a certain data bit interval (TB);

inputting the selected binary signal to a coder;

counting bits in the input binary signal and recognizing certain bit patterns according to a number of counted bits and their logic states in the input binary signal;

establishing a code word table in the coder having certain code words for associating with said certain bit patterns;

reading code words in the code table according to the recognized bit patterns; and producing, according to the code words read from the code table, a coded digital signal corresponding to said input binary signal wherein the two logic states of the binary signal are each represented by a symmetric pulse train one of which has a lower frequency f1 and the other having a higher frequency f2, setting the higher frequency f2 equal to the number of data bits transmitted each second divided by two Hertz (½TB), and causing a transition between the two pulse trains to be such that the run length digital sum (RDS) of the coded digital signal is zero within the duration of three or four data bit intervals (3TB or 4TB).

2. A method according to claim 1, wherein the coded digital signal is produced as a truly binary signal having solely two levels.

3. A method according to claim 1, including producing the coded digital signal so that a ratio between a longest and a shortest time lapse between two mutually sequential changes in signal level to be at most 4:1.

4. A method according to claim 1, including producing the coded digital signal so that the time lapse between two mutually sequential changes in signal level is from 1 to 4 times the duration of a data bit interval (TB) in steps of ½ times the duration of a data bit interval.

5. A method according to claim 1, including producing the coded digital signal in such a way that a sequence of logic ones in the input binary signal produce a change in signal level in the middle of each bit interval (TB) of the coded digital signal, and in that when a logic one is preceded by a logic zero in the input binary signal, there is no change in the signal level during the bit interval (TB) of the coded digital signal.

6. A method according to claim 1, including producing the coded digital signal so that the occurrence of a single logic zero (0) followed by a one (1) in the input binary signal is represented in the Coded digital signal as a change in signal level after that bit interval (TB) in which the logic zero is included, and the occurrence of two logic zeroes (0) in a sequence which is followed by a one (1) in the input binary signal is represented in the coded digital signal as a change in signal level in the middle of the bit interval (TB) that includes the second logic zero.

7. A method according to claim 1, including producing the coded digital signal so that a sequence of three logic zeroes (0) followed by a one (1) in the input binary signal is represented in the coded digital signal as a change in the signal level after each bit interval (TB) that includes a logic zero.

8. A method according to claim 1, including producing the coded digital signal so that a sequence of three logic zeroes (0) followed by a one (1) in the input binary signal is represented in the coded digital signal as a change in the signal level after the second bit interval (TB).

9. A method according to claim 1, including a zero coding step wherein a sequence of three logic zeroes (0) followed by at least a further zero (0) in the input binary signal is represented in the coded digital signal as a change in the signal level in the middle of that bit interval (TB) which includes the second zero (0) and a further change in the signal level at the end of that bit interval (TB) which includes the third zero (0), and said zero coding step is repeated until fewer than four zeroes remain in the input binary signal.

10. A coder for producing a coded digital signal which represents a selected binary signal having two logic states, wherein the coded digital signal exhibits a continuous series of changes in signal level and the two logic states of the selected binary signal are each represented by a respective symmetrical pulse train having frequencies f1 and f2, the coder comprising:

code generation circuit means having an input responsive to the selected binary signal, for counting bits in the input binary signal and recognizing certain bit patterns according to a number of counted bits and their logic states in the input binary signal;

the code generation circuit means including a code word table having certain code words for association with said certain bit patterns;

shift register means having an input coupled to an output of the code generation circuit;

an OR gate having one input coupled to said output of the code generation circuit means and a second input coupled to the input binary signal, and an output of said OR gate is coupled to a charging input of said shift register means; and a bistable circuit having an input coupled to an output of said shift register means, and an output from which the coded digital signal can be obtained.

* * * * *